United States Patent [19]

Takahashi

[11] Patent Number: 5,237,132
[45] Date of Patent: Aug. 17, 1993

[54] METALLIC PRINTED CIRCUIT BOARD WITH COUNTERSUNK MOUNTING HOLE

[75] Inventor: Hayao Takahashi, Kanagawa, Japan

[73] Assignee: NHK Spring Co., Ltd., Japan

[21] Appl. No.: 716,573

[22] Filed: Jun. 17, 1991

[51] Int. Cl.⁵ ............................................. H05K 1/00
[52] U.S. Cl. .................................... 174/262; 174/266; 428/901
[58] Field of Search ............... 174/254, 250, 255, 256, 174/262, 263, 266; 357/65, 68; 361/397, 410; 428/901

[56] References Cited

U.S. PATENT DOCUMENTS

| | | | |
|---|---|---|---|
| 3,142,783 | 7/1964 | Warren | 174/262 |
| 3,411,148 | 11/1968 | Fetterolf et al. | |
| 4,107,836 | 8/1978 | Roberts | |
| 4,491,622 | 1/1985 | Butt | 174/256 |

Primary Examiner—Lincoln Donovan
Assistant Examiner—Cheryl R. Figlin
Attorney, Agent, or Firm—Skjerven, Morrill, MacPherson, Franklin, & Friel

[57] ABSTRACT

To the end of forming a countersunk hole in a metallic printed circuit board consisting of a metallic plate, an insulating layer, and a printed circuit pattern formed on the insulating layer, for receiving a countersunk head of a mounting screw which is passed through the hole, a rough straight hole consisting of a central main part and radial extensions extending therefrom is first formed in the metallic printed circuit board, and a countersunk portion is formed around the hole by plastic deformation. Since the material of the metallic plate of the metallic printed circuit board is allowed to flow into the extensions of the hole during plastic deformation, the material of the metallic plate in the immediate vicinity of the hole is allowed to flow both radially and circumferentially, and the resulting reduction in the difference in the amount of deformation between the metallic plate and the insulating layer prevents the peeling of the insulating layer from the metallic plate.

9 Claims, 3 Drawing Sheets

METALLIC PRINTED CIRCUIT BOARD WITH COUNTERSUNK MOUNTING HOLE

TECHNICAL FIELD

The present invention relates to metallic circuit board having a laminated structure comprising a metallic plate and an insulating layer carrying a printed circuit pattern, and having a countersunk mounting hole.

BACKGROUND OF THE INVENTION

A metallic circuit board generally consists of a metallic plate made of aluminium, steel or other metallic material, an insulating layer placed thereon, and a printed circuit pattern formed on the insulating layer. Because such a metallic circuit board can be used as a structural member, it can contribute to the reduction in the size of the equipment or the system into which it is incorporated. For instance, a metallic circuit board is widely used as a part of the casing of a floppy disk drive unit for the purpose of reducing its thickness. In such applications, countersunk holes are formed in the metallic circuit board so that countersunk head screws may be used for securing the metallic printed circuit board to other parts of the equipment without involving any protrusions from the surface of the metallic printed circuit board.

Conventionally, such countersunk holes have been formed by using chamfering cutters and drill bits, but such a machining process produces metallic chips which are required to be thoroughly removed for the metallic printed circuit board to be safely used in electronic equipment, and this significantly impairs the manufacturing efficiency. Further, such machining work requires cutting oils and compounds, and they also must be thoroughly removed.

Alternatively, it is conceivable to use a cylindrical punch having a conical or otherwise tapered end surface so as to form a countersunk hole in cooperation with a suitable die. Such a punching process requires less time and incurs less cost than a machining process. However, the pressure from the punch causes the material of the metallic plate in the immediate vicinity of the hole to flow radially inwardly, and the resulting relative shifting between the metallic base plate and the insulating layer tends to cause peeling of the insulating layer from the metallic base plate.

BRIEF SUMMARY OF THE INVENTION

In view of such problems of the prior art, a primary object of the present invention is to provide an improved method for economically forming a countersunk hole in a metallic printed circuit board without damaging the metallic printed circuit board.

A second object of the present invention is to provide an improved method for forming a countersunk hole in a metallic printed circuit board which minimizes the possibility of damaging the insulating layer of the metallic printed circuit board.

A third object of the present invention is to provide a metallic printed circuit board having a mounting hole formed by such a method.

These and other objects of the present invention can be accomplished by providing (1) a method for forming a mounting hole in a laminated metallic printed circuit board comprising a metallic plate, an insulating layer formed on the metallic plate, and a printed circuit pattern formed on the insulating layer, comprising the steps of: forming a substantially straight rough hole through the metallic printed circuit board, the hole consisting of a central main part and a plurality of radial extensions each extending locally and radially from the central main part into a peripheral region of the metallic printed circuit board surrounding the central main part; and forming a countersunk portion around the central main part of the hole by plastic deformation of parts of the metallic plate located between the radial extensions and immediately around the central main part of the hole: and (2) a metallic printed circuit board having a laminated structure comprising a metallic plate, an insulating layer formed on the metallic plate, and a printed circuit pattern formed on the insulating layer, wherein: at least one hole is passed completely through the metallic printed circuit board, the hole consisting of a central main part and a plurality of radial extensions each extending locally and radially from the central main part into a peripheral region of the metallic printed circuit board surrounding the central main part, a countersunk portion being defined in parts of the metallic plate located between the radial extensions and immediately around the central main part of the hole.

In this way, when the pressure from the punch for giving a countersunk shape to the simply formed rough hole is applied to the metallic plate, the material of the metallic plate in the immediate vicinity of the hole can flow not only radially but also circumferentially, and the relative shifting between the metallic plate and the insulating layer is minimized.

The straight rough hole may be formed by any known process such as a punching process, a swaging process, a broaching process, or other machining process. It is also possible to use a laser cutting process, or other chemical process for forming a hole in a metallic plate. When a punching process is employed, the punch may consist of a central main part and radial extensions extending radially from the central main part of the punch. Preferably, each of the extensions of the punch is provided with a V-shaped cross-section with its pointed end facing away from the central main part of the punch. The hole may have other shapes as long as they comprise a central main part for receiving a screw, and a plurality of gaps around the periphery of the hole in the way of extensions extending from the central main part of the hole, and the shape of the hole should be selected according to the thickness and the material of the metallic plate and other considerations.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
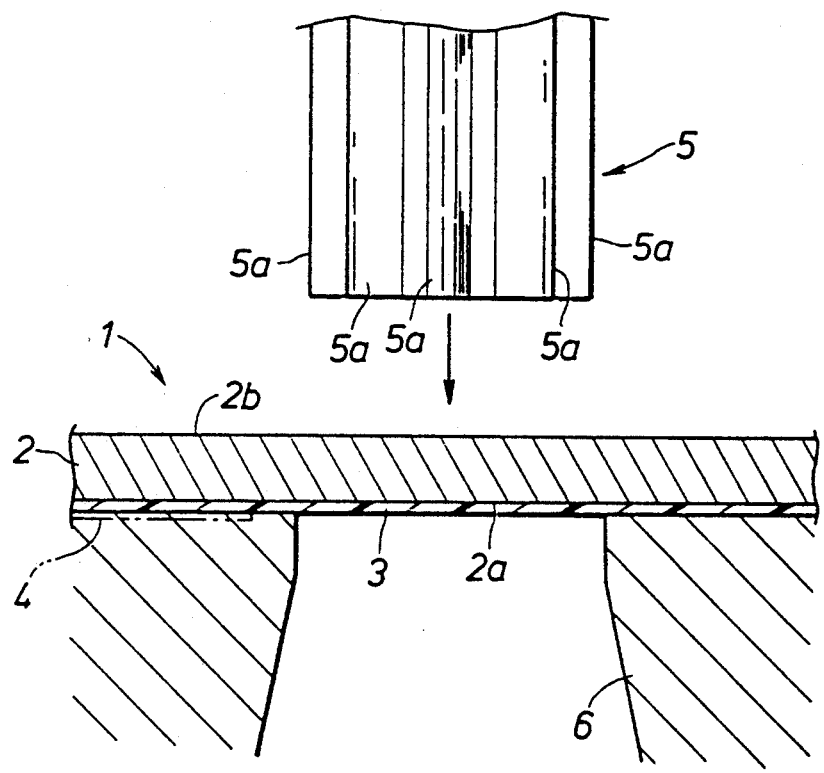
FIG. 1 is a sectional view showing the process of forming a straight rough hole in a metallic printed circuit board by using a punch and die assembly according to the method of the present invention.

FIG. 1 is a sectional view showing the process of forming a straight rough hole as a preliminary step for forming a countersunk hole in a metallic printed circuit board 1. Such a hole may be typically but not exclusively used for passing a screw or a threaded bolt having a countersunk head and securing the metallic printed circuit board to other parts of the equipment. This metallic printed circuit board 1 consists of a metallic base plate 2, for instance, made of steel, an insulating layer 3 placed thereon, and a printed circuit pattern 4 formed on the insulating layer 3. The insulating layer 3 typically consists of epoxy resin reinforced by glass fiber cloth, and the printed circuit pattern 4 typically consists of copper foil deposited on the insulating layer 3. Such a metallic printed circuit board is typically used in a floppy disk drive unit which is required to have a very small thickness.

Figure 2:
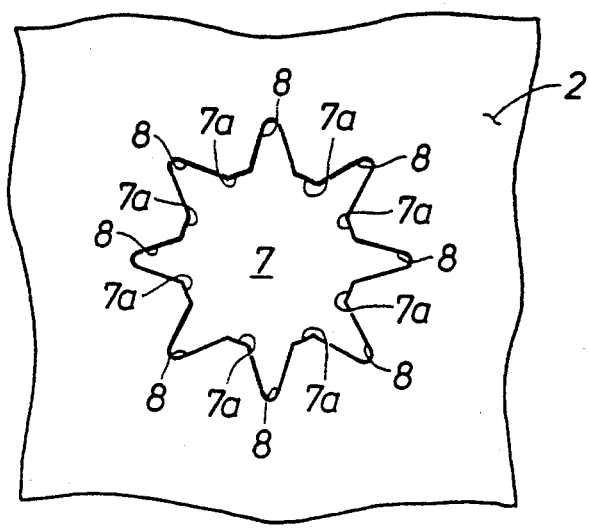
FIG. 2 is a plan view of the straight rough hole.

First of all, the straight rough hole is formed by the punching process employing a punch 5 and a die 6, and, as indicated by the arrow in FIG. 1, the punch 5 is pushed into the metallic printed circuit board 1 which is supported against the die 6. The punch 5 has a generally cylindrical shape and is additionally provided with a spline around its outer circumference, the spline consisting of eight longitudinal ridges 5a extending longitudinally at equal angular interval. Therefore, as shown in FIG. 2, the rough hole 7 formed by the punch 5 consists of a main part 7a formed by the circular circumferential edge of the central main part of the punch 5 and extensions 8 formed by the ridges 5a. The rough hole 7 may also be formed by laser, broaching, and other machining processes instead of the punching process using a punch and a die.

Figure 3:
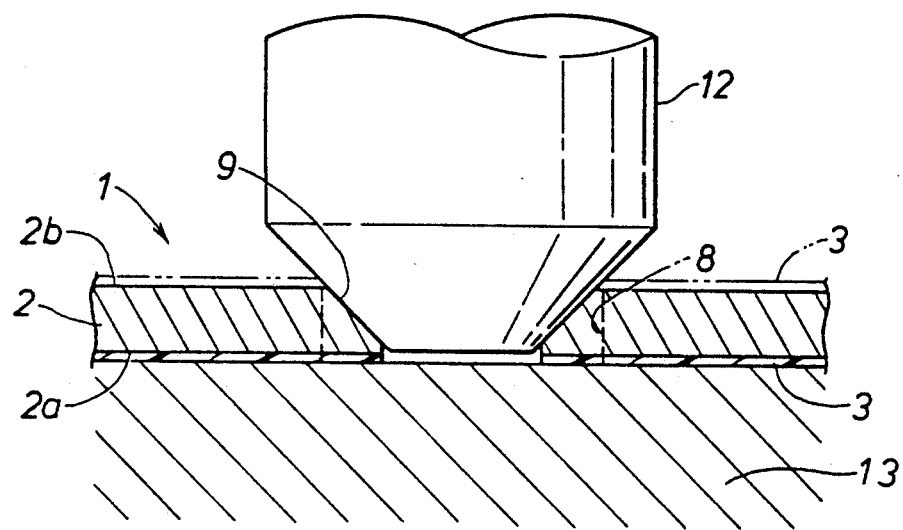
FIG. 3 is a sectional view showing the process of forming a countersunk portion around the hole by using a punch and die assembly according to the method of the present invention.
Figure 4:
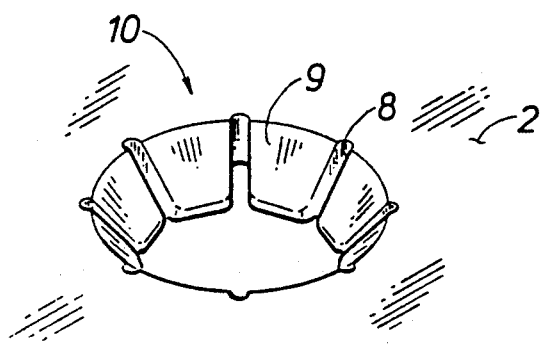
FIG. 4 is a perspective view of the completed hole.

The rough hole 7 formed in the metallic printed circuit board 1 is then given with the countersunk configuration by a suitable chamfering process. To this end, according to the present embodiment, a cylindrical punch 12 having a conical front end is applied coaxially to the rough hole 7 from the reverse surface 2b of the metallic plate 2 facing away from the insulating layer 3 of the metallic printed circuit board 1 with the metallic circuit board 1 supported against a planar die 13 as illustrated in FIG. 3. The diameter of the punch 12 is at least larger than that of the central main part of the punch 5, and produces a countersunk portion 9 on the inner peripheral part of the central main part of the hole 7 by plastic deformation as illustrated in FIG. 4. The present invention can also be applied to the case where an additional insulating layer is provided on the reverse surface of the metallic printed circuit board as indicated by the imaginary line in FIG. 3 or, in other words, where the metallic printed circuit board 1 is provided with an insulating layer 3 and a printed circuit pattern on each face of the metallic printed circuit board 1.

By thus forming a hole 10 having a countersunk portion 9, it becomes possible to use a threaded bolt having a countersunk head for securing this metallic printed circuit board 1 in the floppy disk drive unit. Normally, a threaded bolt 11 having a countersunk head is passed through this hole 10, and screwed into a threaded hole provided in the casing of the floppy disk drive unit. Since the head of the threaded bolt 11 is at least partly submerged in the countersunk portion of the hole 10, there is very little or no protrusion from the surface of the metallic printed circuit board 1, and this contributes to the reduction in the thickness of the floppy disk drive unit.

Figure 5:
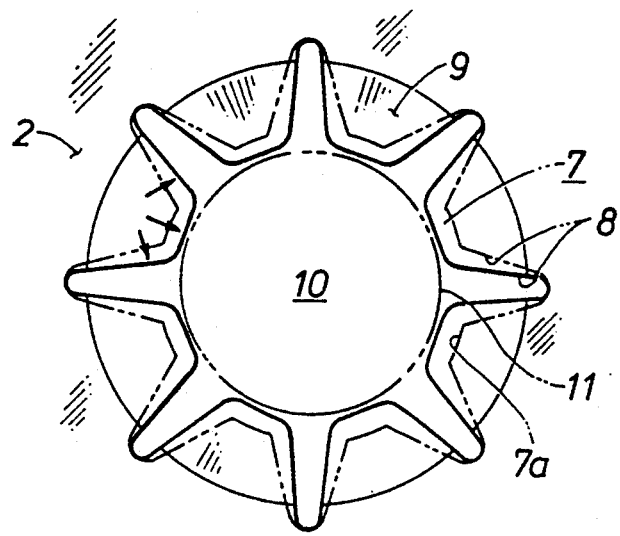
FIG. 5 is a plan view of the completed hole.

If the rough hole has a simple circular configuration and a countersunk portion is similarly formed by applying a punch having a conical forward end, the material of the metallic plate 2 adjacent the rough hole 10 tends to flow radially, and the resulting shifting or the deviation between the metallic plate and the insulating layer causes the peeling of the insulating layer. On the other hand, according to the present invention, since the countersunk portion 9 as indicated by the solid line in FIG. 5 is formed on the inner peripheral portion of the hole 10 which was initially as indicated by the imaginary line in FIG. 5, the material which was pushed out during the plastic formation of the countersunk portion can flow into the extensions 8, and the material can flow both circumferentially and radially in a favorable condition with the result that the load acting upon the reverse surface 2b of the metallic plate 2 is favorably distributed, and the peeling of the insulating layer can be avoided.

Figure 6:
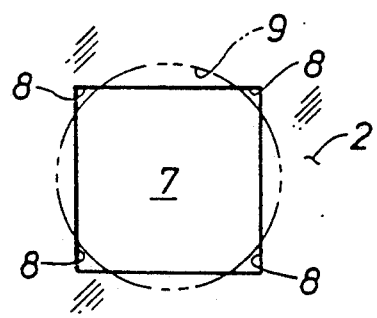
FIGS. 6 through 8 are plan views showing second through fourth embodiments of the shape of the hole according to the present invention.
Figure 7:
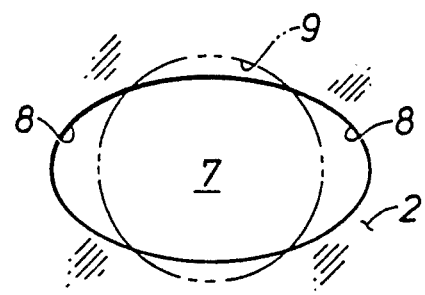
Figure 8:
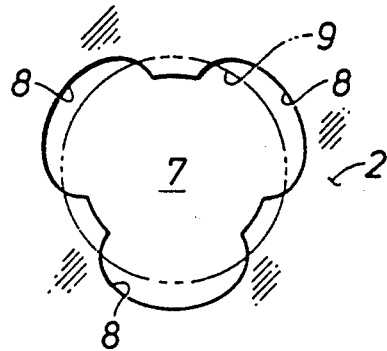

The shape of the rough hole 7 should be changed according to the thickness and the material property of the metallic printed circuit board as well as the size of the threaded bolt. The rough hole in the above embodiment is provided with eight equally spaced, V-shaped extensions 8 around the hole 10, but it is possible to provide two or more extensions of arbitrary configuration on diametrically opposed positions on the inner periphery of the rough hole 7 to achieve the same object. The extensions 8 are not limited to the V-shape ones, but may also have a U-shape, rectangular shape, or circular or elliptic shape. In the embodiment illustrated in FIG. 6, the extensions 8 are given as corners of a rectangle, and the countersunk portion 9 is provided in a middle part of each of the four sides. In the embodiment illustrated in FIG. 7, the extensions 8 are give as two ends on the long axis of an ellipsis, and the countersunk portion 9 is formed on each end of the ellipsis on the short axis. In the embodiment illustrated in FIG. 8, the hole having the extensions 8 is formed by using a punch consisting of a cylindrical central main part and three lobes formed around it. The hole is given with a final configuration similar to a clover leaf. The countersunk portion 9 is formed on each of the inner peripheral portions of the central hole which are located between adjacent extensions 8.

The countersunk portion 9 was formed by a simple pressing process in the above described embodiment, but it is possible to use other plastic forming processes such as swaging.

Thus, according to the present invention, since the flow of material resulting from the plastic deformation for the purpose of forming the countersunk portion can be distributed both radially and circumferentially, the peeling of the insulating layer from the metallic printed circuit board can be avoided. In particular, because the countersunk portion for accommodating a countersunk head of a threaded bolt can be formed by a simple punch and die process, the size of the system incorporating this metallic printed circuit board can be reduced, and the manufacturing cost can be reduced.

Although the present invention has been described in terms of preferred embodiments thereof, it is obvious to a person skilled in the art that various alterations and modifications are possible without departing from the scope of the present invention which is set forth in the appended claims.

What we claim is:

1. A metallic printed circuit board having a metallic plate, an insulating layer on said plate, a printed circuit pattern on said insulating layer and a hole extending through said metallic plate and said insulating layer, said hole having a central main part, a plurality of spaced radial hole extensions each extending radially from said central main part into a peripheral region of said metallic plate surrounding said central main part and a countersunk plastically deformed chamfer portion around said central main part and located between said radial extensions, said chamfer portion having a final fixed configuration sized for reception of a mounting screw head.

2. A metallic printed circuit board having a laminated structure comprising a metallic plate, an insulating layer formed on said metallic plate, and a printed circuit pattern formed on said insulating layer, wherein:

at least one hole is passed completely through said metallic printed circuit board, said hole consisting of a central main part and a plurality of radial hole extensions each extending locally and radially from said central main part into a peripheral region of said metallic printed circuit board surrounding said central main part, a countersunk portion being defined in parts of said metallic plate located between said radial hole extensions and immediately around said central main part of said hole.

3. A metallic printed circuit board including a metallic base plate, an insulating layer on said base plate, a printed circuit pattern on said insulating layer and countersunk hole means extending into said base plate for receiving countersunk head screws for securing said board to other structure; said countersunk hole means comprising means for forming a central hole in said base plate, means for forming at least two slotted hole extensions in said base plate extending radially outwardly from said central hole and means for forming a countersunk surface in said base plate extending radially between said slot extensions.

4. The printed circuit board of claim 3 wherein said slotted hole extensions extend perpendicularly to a surface plane of base plate and said countersunk surface means is bounded by an edge of two adjacent slotted hole extensions and an outer periphery of said central hole and extends as a chamfer into said base plate.

5. The printed circuit board of claim 3 wherein said countersunk surface is a chamfer extending between said slotted hole extensions.

6. The printed circuit board of claim 3 in which each of said slotted hole extensions are V-shaped in cross-section with a pointed end facing away from said central hole.

7. The printed circuit board of claim 3 in which said slotted hole extensions are corner portions of a rectangle extending peripherally outward of said central hole.

8. The printed circuit board of claim 3 in which said slotted hole extensions are elliptical ends of an ellipse extending from said central hole.

9. The printed circuit board of claim 3 in which said slotted hole extensions are a plurality of lobes extending from said central hole.

* * * * *